(12) United States Patent
Lin et al.

(10) Patent No.: US 10,222,420 B2
(45) Date of Patent: Mar. 5, 2019

(54) TRANSITION TEST GENERATION FOR DETECTING CELL INTERNAL DEFECTS

(71) Applicant: Mentor Graphics Corporation, Wilsonville, OR (US)

(72) Inventors: Xijiang Lin, West Linn, OR (US); Wu-Tung Cheng, Lake Oswego, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 107 days.

(21) Appl. No.: 15/400,904

(22) Filed: Jan. 6, 2017

(65) Prior Publication Data

US 2017/0193155 A1 Jul. 6, 2017

Related U.S. Application Data

(60) Provisional application No. 62/275,562, filed on Jan. 6, 2016.

(51) Int. Cl.
*G01R 3/00* (2006.01)
*G06F 17/50* (2006.01)
*G01R 31/3183* (2006.01)

(52) U.S. Cl.
CPC ........... *G01R 31/318371* (2013.01); *G01R 31/318364* (2013.01); *G01R 31/318307* (2013.01); *G06F 17/5022* (2013.01); *G06F 17/5027* (2013.01); *G06F 17/5045* (2013.01); *G06F 17/5059* (2013.01)

(58) Field of Classification Search
CPC ............. G06F 17/5022; G06F 17/5027; G06F 17/5045; G06F 17/5059; G01R 31/31813; G01R 31/3188; G01R 31/318307
USPC ................. 714/738, 741; 716/104, 106, 136
See application file for complete search history.

(56) References Cited

U.S. PATENT DOCUMENTS

| | | | |
|---|---|---|---|
| 7,613,971 B2* | 11/2009 | Asaka ............. | G01R 31/31858 714/25 |
| 2003/0093733 A1* | 5/2003 | Zhang ............ | G01B 31/318307 714/726 |
| 2004/0123206 A1* | 6/2004 | Rohrbaugh ...... | G01R 31/31704 714/741 |

(Continued)

OTHER PUBLICATIONS

X. Lin, and J. Rajski, "Test Generation for Interconnect Opens," in Proc. Intl. Test Conf., paper 33.1, 2008.

(Continued)

*Primary Examiner* — Stacy Whitmore

(57) ABSTRACT

Aspects of the disclosed technology relate to techniques of test pattern generation based on the cell transition fault model. An assignment for two consecutive clock cycles at inputs of a complex cell in a circuit design is determined based on a gate-level representation of the circuit design. The assignment includes a first transition at one of the inputs which is sensitized by remaining part of the assignment to cause a second transition at an output of the complex cell. A test pattern that generates the assignment at the inputs and propagates a value at the output corresponding to the second clock cycle of the two consecutive clock cycles from the output to an observation point is then derived based on the gate-level representation.

19 Claims, 12 Drawing Sheets

Flow chart
1200

(56) References Cited

U.S. PATENT DOCUMENTS

2011/0197171 A1* 8/2011 Wang ............... G01R 31/31704
 716/107
2013/0305200 A1* 11/2013 Wang ............... G01R 31/31704
 716/107
2015/0040087 A1* 2/2015 Lin ................ G01B 31/318575
 716/109

OTHER PUBLICATIONS

R. L. Wadsack, "Fault Modeling and Logic Simulation of CMOS and MOS Integrated Circuits," in Bell Syst. Tech. J., pp. 1449-1473, May-Jun. 1978.
H. Cox and J. Rajski, "Stuck-Open and Transition Fault Testing in CMOS Complex Gates," in Intl. Test Conf., pp. 688-694, 1988.
M. Belkadi, et al., "Modeling and Test Generation for MOS Transmission Gate Stuck-open Faults," in IEE Proceedings-G, vol. 139, No. 1, pp. 17-22, Feb. 1992.
J. C. M. Li, et al., "Testing for Resistive Opens and Stuck Opens", in Intl. Test Conf., pp. 1049-1058, 2001.
N. Devtaprasanna, et al., "A Unified Method to Detect Transistor Stuck-Open Faults and Transition Delay Faults," in European Test Symp., pp. 185-192, 2006.
B. Benware, et al., "Affordable and Effective Screening of Delay Defects in ASICs Using the Inline Resistance Fault Model", in Intl. Test Conf., pp. 1285-1294, 2004.
J. A. Waicukauski, et al., "Transition Fault Simulation", in IEEE Design and Test of Computers, pp. 32-38, 1987.
C. Han and A.D. Singh, "Hazard Initialized LOC Tests for TDF Undetectable CMOS Open Defects", in Asian Test Symp, pp. 189-194, 2013.
C. Han and A.D. Singh, "Improving CMOS Open Defect Coverage Using Hazard Activated Tests", in Proc. VLSI Test Symp. 2014.

* cited by examiner

TRANSITION TEST GENERATION FOR DETECTING CELL INTERNAL DEFECTS

RELATED APPLICATIONS

This application claims the benefit of U.S. Provisional Patent Application No. 62/275,562, filed on Jan. 6, 2016, entitled "Detection of transistor stuck-open faults" and naming Xijiang Lin et al. as inventors, which application is incorporated entirely herein by reference.

FIELD OF THE DISCLOSED TECHNOLOGY

The present disclosed technology relates to circuit testing. Various implementations of the disclosed technology may be particularly useful for detecting cell internal defects.

BACKGROUND OF THE DISCLOSED TECHNOLOGY

When the manufacturing technology moves to deep sub-micron process, physical defects such as shorts, opens, and bridges introduced during fabrication process show up not only at interconnects between CMOS (Complementary Metal-Oxide Semiconductor) cell terminals, but also inside the CMOS cells. The physical failure analysis had revealed that open defects are one of major failure mechanisms during manufacture. Open defects (sometimes referred to as opens) can be classified into two categories: interconnect opens and cell internal opens. The interconnect open is a defect located at a net connecting cell terminals. A complete interconnect open makes the cell input float and the voltage at the floating net is hard to predict. A resistive interconnect open (interconnect open with finite resistance) introduces extra delay to the circuit and may make the chip fail to operate at the functional speed. The cell internal open is a defect located inside the CMOS cells and this type of defects includes transistor opens, transistor terminal opens, net opens, and open vias, etc. FIG. 3 shows an example of various open defects inside and outside of a CMOS cell. In the figure, a transistor open 330, a transistor terminal open 340, and a net open 320 are inside a CMOS cell 300 while an interconnect open 310 are outside the CMOS cell 300.

The behavior of complete interconnect opens had been studied extensively in the past. The voltage at an open net may be determined by parasitic capacitances between the open net and its neighboring nets, transistor capacitances to the open net, trapped charge deposited on the open net, and RC interconnect behavior of the die surface. The resistive interconnect open is often targeted as a delay fault. To detect the defect, it needs to apply a transition test including two vectors that launch the transition at the fault site and propagate the fault effect to an observation point such as a scan cell or a primary output.

Inside a CMOS cell, a transistor open or a transistor terminal open causes the transistor non-conducting permanently. The defect blocks the charging/discharging path(s) to/from internal nodes. This type of open defects is modeled as transistor stuck-open (TSOP) fault. To detect an n-FET (p-FET) (field-effect transistor) TSOP fault, a test includes two vectors. The first vector turns on one or more charging (discharging) paths that drive the output of the CMOS cell to 1(0) and subsequently the second vector turns on the discharging (charging) path passing through the transistor. A transistor open or a transistor terminal open associated with the transistor can be detected as it breaks the discharging (charging) path and the output of the CMOS cell holds its previous value 1(0) rather than 0(1).

FIG. 4 illustrates an example of a NAND cell (410) and an example of a NOR cell (420). When the first vector applied to cell inputs A and B of the NAND cell 410 is (1,1), cell output Z will be driven to 0 through transistors N1 and N2. When the second vector (0,1) is then applied, the cell output Z is charged to 1 through transistor P1 (a p-FET transistor) assuming there is no defect on the charging path. If there is an open defect associated with the transistor P1, the cell output Z of the NAND cell 410 will stay at 0 instead due to the open on the charging path.

To detect an open defect associated with N1, an n-FET transistor of the same cell, the first vector applied to the cell inputs A and B can be (0,0) or (0,1) which is denoted as (0,X)) and the second vector needs to be (1,1). The cell output Z of the NAND cell 410 is first charged to 1 through the transistor P1 or either of the transistors P1 and P2. The discharging path through N1 and N2 is activated by the second vector and the cell output Z is driven to "0". However, if there is an open defect associated with N1, the discharging path will be blocked and the cell output Z of the NAND cell 410 will remain at "1".

Similarly, the input assignment for detecting an open defect associated with P1 in the NOR cell 420 is (1,X) for the first vector and (0,0) for the second vector. To detect an open defect associated with N1 in the same cell, the input assignment is (0,0) for the first vector and (1,0) for the second vector. FIG. 5 summarizes the tests (input assignments and good machine output values) for detecting transistor stuck-open faults inside three primitive cells implementing the logic functions of the primitive gates NOT, NAND, and NOR. In the figure, the left column and the right column of the input assignment and the output for each of the gates represent values for the first clock cycle and the second clock cycle, respectively.

The transistor stuck-open fault belongs to a sequence-dependent failure rather than a timing failure. This is in contrast to the conventional transition fault which represents a gross delay at a cell terminal. The transition fault assumes that the delay at the fault site is large enough to cause logic failure. To detect a slow-to-rise (slow-to-fall) fault, the test also includes two vectors but is applied at the functional speed. The first vector sets up an initial value 0(1) at the fault site. The second vector switches the fault site value to 1(0) and propagates the activated stuck-at-0(1) fault at the fault site to an observation point. FIG. 6 shows the necessary assignments to detect slow-to-rise and slow-to-fall transition faults at the input A of the three primitive cells shown in FIG. 5. Comparing FIGS. 5 and 6, it is evident that the necessary input assignments for detecting transistor stuck-open faults are more stringent than those for detecting transition faults. A test pattern generated for detecting a transistor stuck-open fault inside a primitive cell can also detect a transition fault at the gate terminal of the primitive cell. It is unnecessary the case the other way around, however.

The above-mentioned method for detecting transistor stuck-open faults inside primitive cells, however, cannot be applied directly to complex cells. A primitive cell or a primitive logic gate is one where all the inputs directly drive a gate of a transistor in a switch-network that is connected to the output. In CMOS, common primitive gates include NOT, NAND, and NOR gates. Sometimes, an AND/OR gates, which can be assembled using a NAND/NOR gate and a NOT gate, may be treated as a primitive gate and be used in a gate-level netlist. A complex cell implements a non-primitive Boolean function and can be represented with two or more primitive logic gates. The representation is often not unique.

FIG. 7 illustrates two gate-level models, 710 and 720, for a complex cell 700. The complex cell 700 implements the logic function of $\overline{A(B+C)}$. To generate the test for a stuck-open fault in the complex cell 700, the method proposed in N. Devtaprasanna, et al., "A Unified Method to Detect Transistor Stuck-Open Faults and Transition Delay Faults," in European Test Symp., pp. 185-192, 2006 (referred to as the Devtaprasanna method), which is incorporated herein by reference, is employed. The test derived for detecting for a stuck-open fault associated with the p-FET P2 transistor using the gate-level model 710 is shown in FIG. 7. This result, however, has a problem because the assignment for input A in the first vector is a don't care bit ("x"). If this don't care bit is filled with "0", the output Z is driven to "1" by the first vector through the transistor P1 and will stay at "1" after the second vector is applied no matter whether the stuck-open fault associated with the p-FET P2 transistor exists or not.

While the correct result can be obtained when applying the Devtaprasanna method to the gate-level model 720 for detecting a stuck-open fault associated with the p-FET P2 transistor, this gate-level model can lead to a problem for detecting a stuck-open fault associated with the n-FET N2 transistor. FIG. 7 shows the result for the Devtaprasanna method with the assignment in the first vector being don't cares for both inputs A and C. The analysis of the cell 700 shows, however, that they cannot be "1" simultaneous in the first vector because the output Z is driven to "0" though the transistors N1 and N3 by the first vector and will stay at "0" after the second vector is applied no matter whether the stuck-open fault associated with the n-FET N2 transistor exists or not.

The above discussion shows that applying traditional methods to gate-level netlists has drawbacks in detecting transistor stuck-open faults inside complex cells since a complex cell may be represented by more than one functionally equivalent gate-level netlist. While the switch-level netlist (modeling each transistor as being "open," "close," and "unkown" and each node (wire) as being 0, 1, and X) of a complex cell can be used to solve the problem, this approach increases the test generation complexity dramatically. Almost all existing ATPG (Automatic Test Pattern Generation) tools generate the tests based on gate-level netlists by modeling the CMOS cells with their functionally equivalent gate level netlists and the fault sites at the cell boundary are targeted during test generation. It is thus desirable to develop a method for detecting transistor stuck-open faults inside complex cells based on gate-level netlists.

BRIEF SUMMARY OF THE DISCLOSED TECHNOLOGY

Aspects of the disclosed technology relate to techniques of test pattern generation based on the cell transition fault model. In one aspect, there is a method comprising: determining, based on a gate-level representation of a circuit design, an assignment for two consecutive clock cycles at inputs of a complex cell in the circuit design including a first transition at one of the inputs which is sensitized by remaining part of the assignment to cause a second transition at an output of the complex cell, the complex cell being represented by two or more logic gates in the gate-level representation, and the sensitizing meaning that the output has no transition if the one of the inputs has no transition while the remaining part of the assignment does not change; deriving, based on the gate-level representation, a test pattern that generates the assignment at the inputs and propagates a value at the output corresponding to second clock cycle of the two consecutive clock cycles from the output to an observation point; and storing the test pattern, which can be used to test integrated circuit devices fabricated based, at least in part, on the circuit design.

The method may further comprise: repeating the determining, the deriving and the storing by replacing the first transition with a third transition, the third transition being opposite to the first transition.

Alternatively or additionally, the method may further comprise: repeating the determining, the deriving and the storing by replacing the second transition with a third transition, the third transition being opposite to the second transition.

Alternatively or additionally, the method may further comprise: repeating the determining, the deriving and the storing by replacing the second transition with a third transition at a second output of the complex cell.

The gate-level representation may be a gate-level netlist. The observation point may be a scan cell or a primary output. The method may be performed by executing an automatic test pattern generation (ATPG) tool in a computer In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Figure 1:
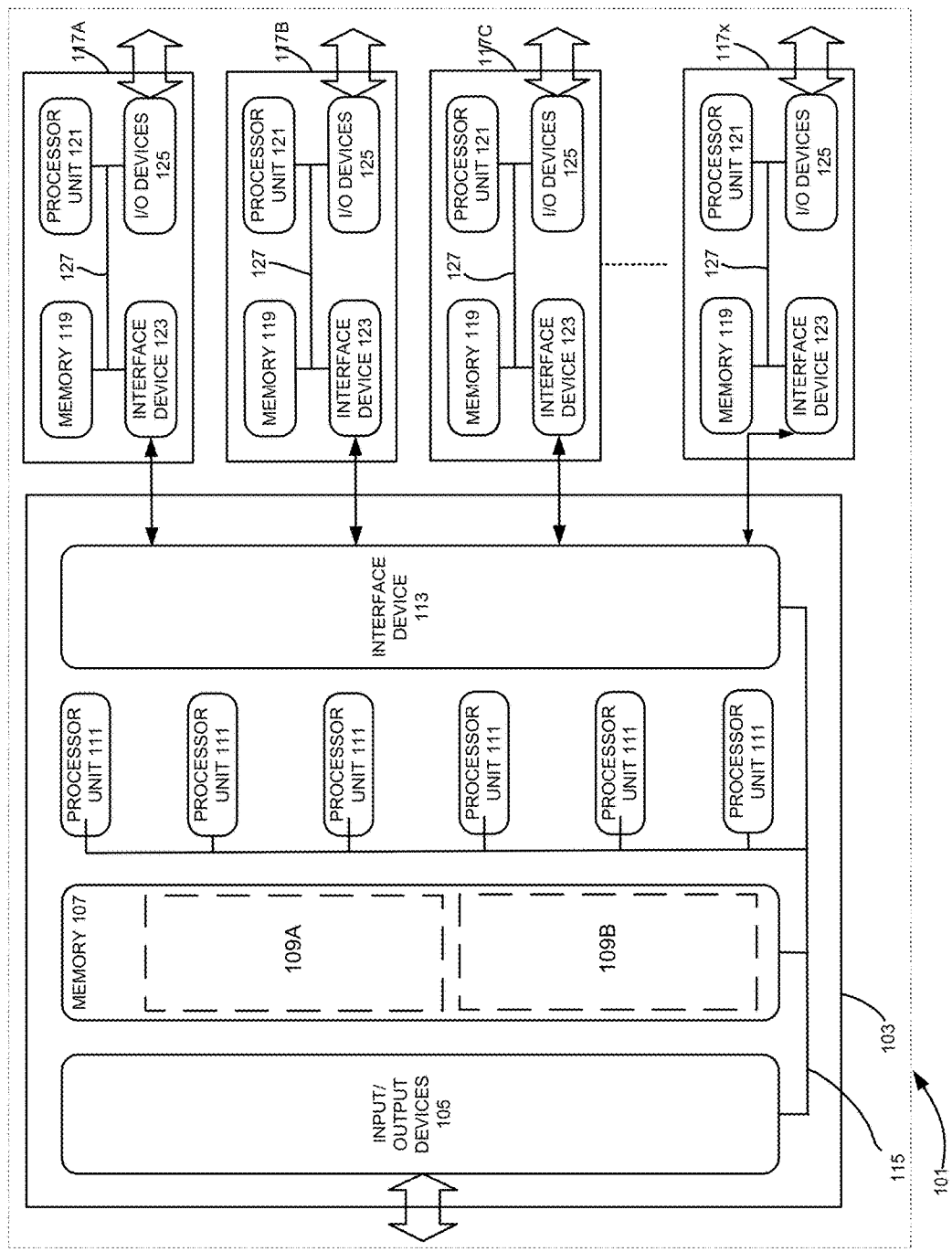
FIG. 1 illustrates an example of a computing system that may be used to implement various embodiments of the disclosed technology.

Various aspects of the present disclosed technology relate to techniques of test pattern generation based on the cell transition fault model. In the following description, numerous details are set forth for purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "derive" and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
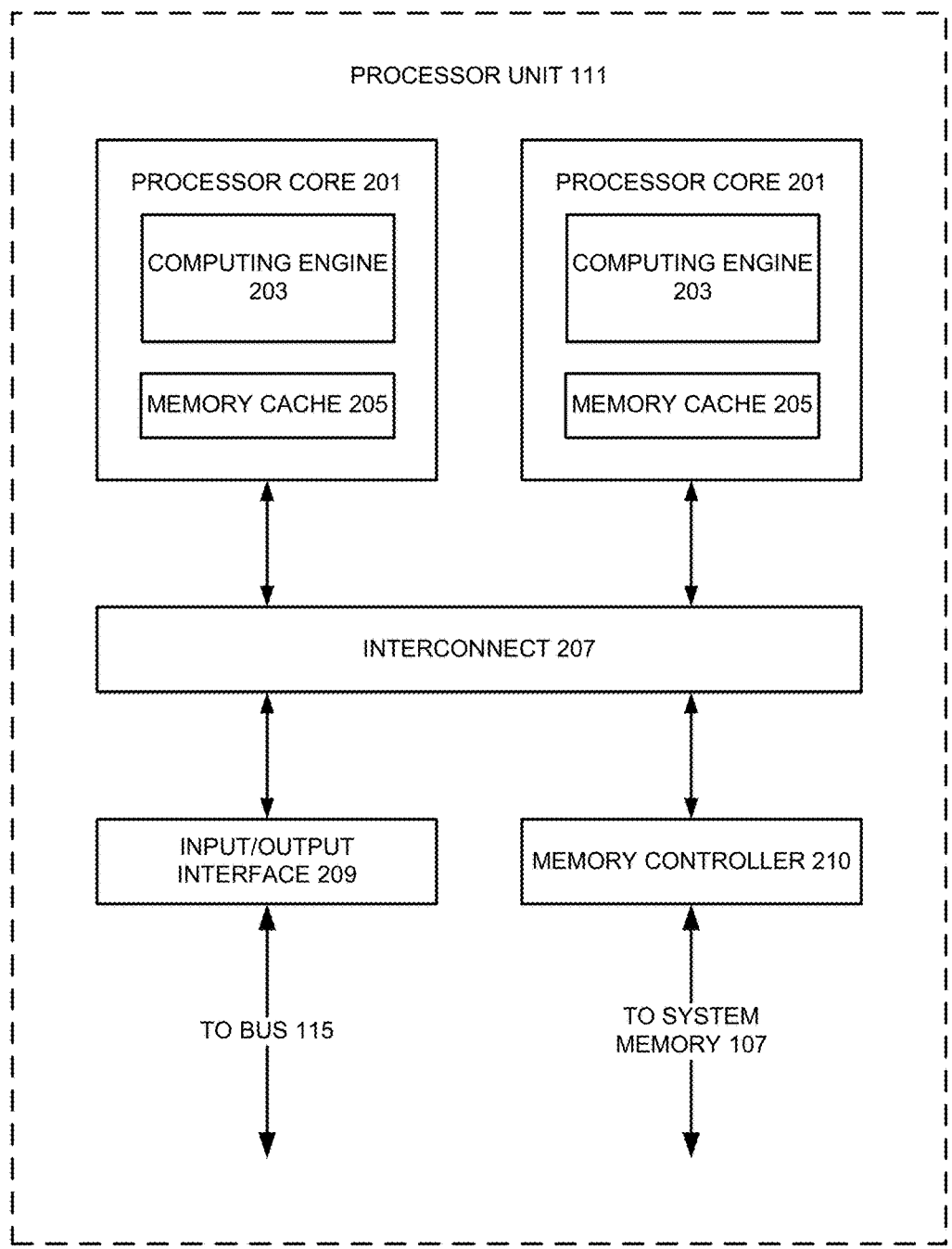
FIG. 2 illustrates an example of a multi-core processor unit that may be used to implement various embodiments of the disclosed technology.
Figure 3:
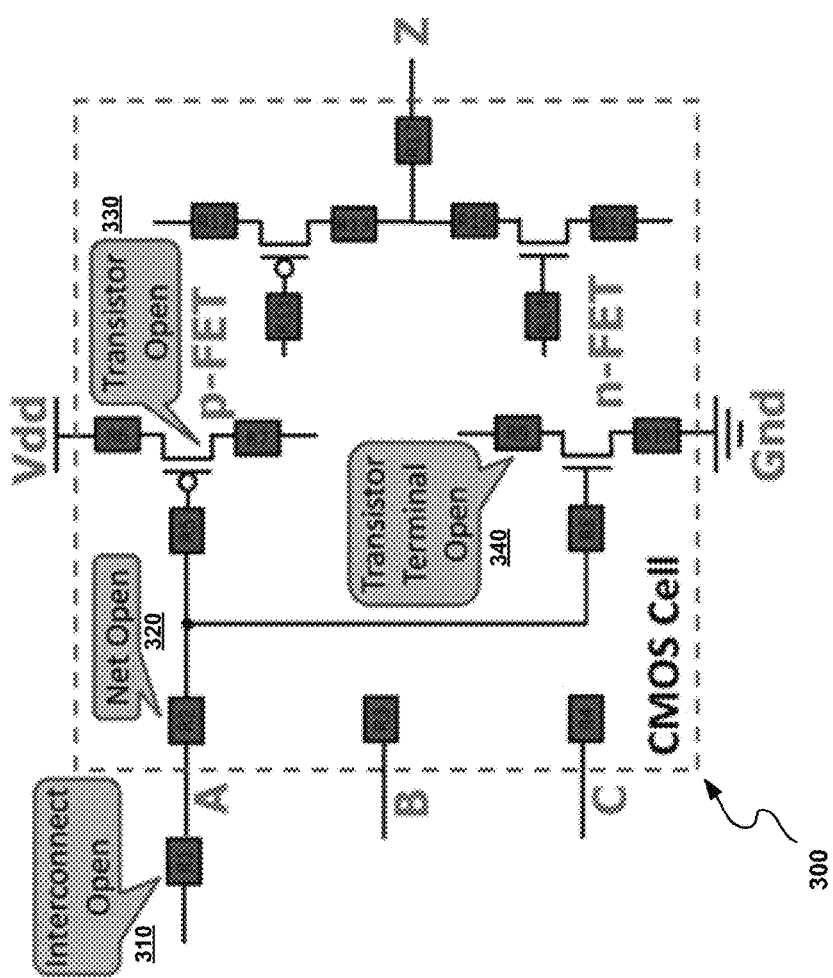
FIG. 3 illustrates an example of various open defects inside and outside of a CMOS cell.
Figure 4:
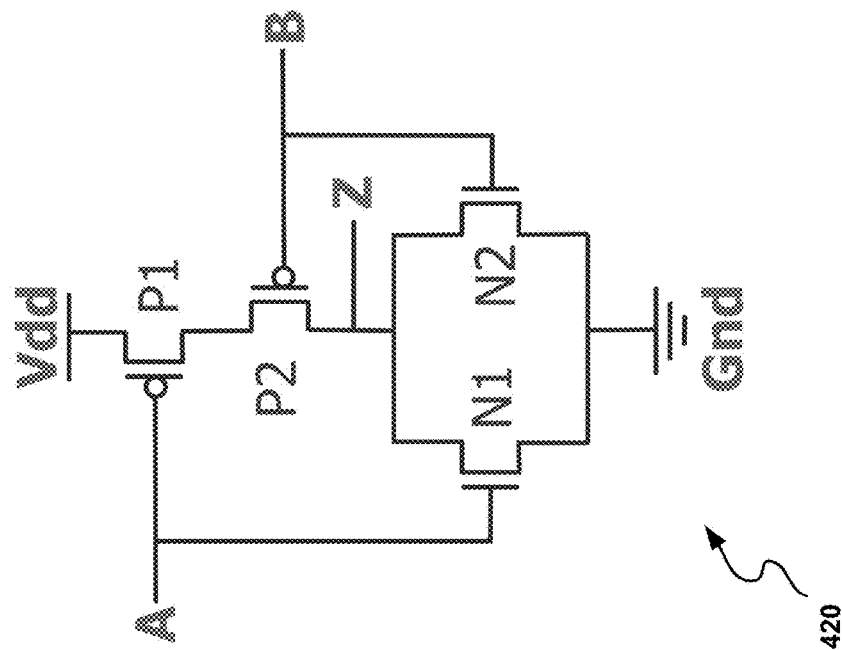
FIG. 4 illustrates an example of a NAND cell (410) and an example of a NOR cell (420).
Figure 4:
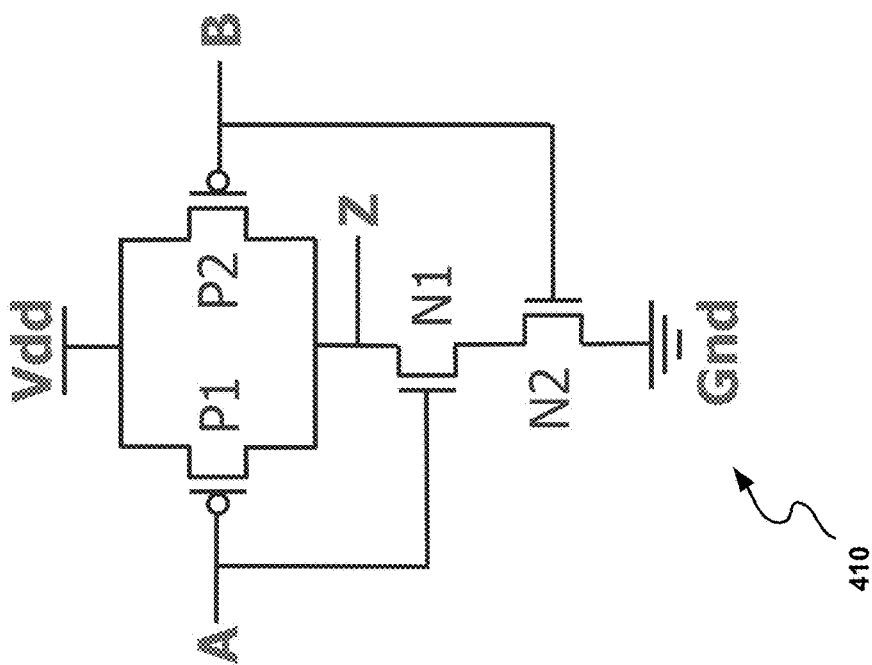
Figure 5:
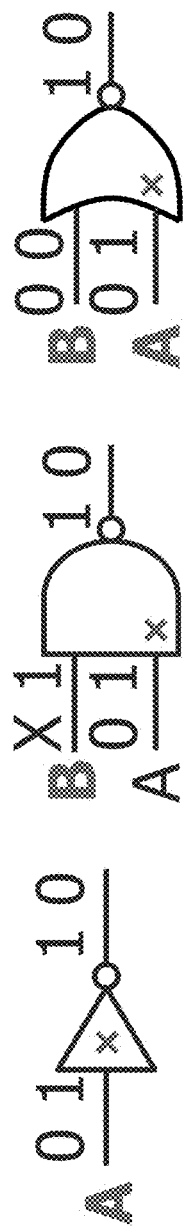
FIG. 5 illustrates tests (input assignments and good machine output values) for detecting transistor stuck-open faults inside three primitive gates NOT, NAND, and NOR.
Figure 5:
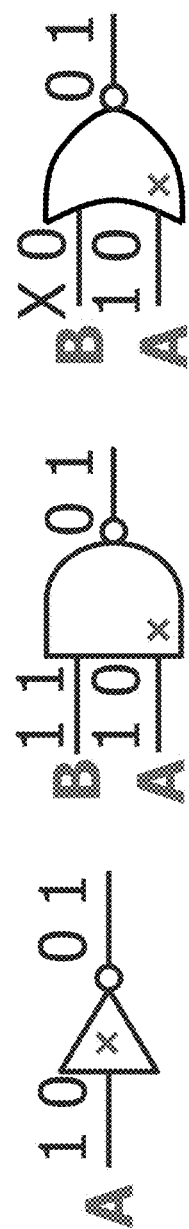
Figure 6:
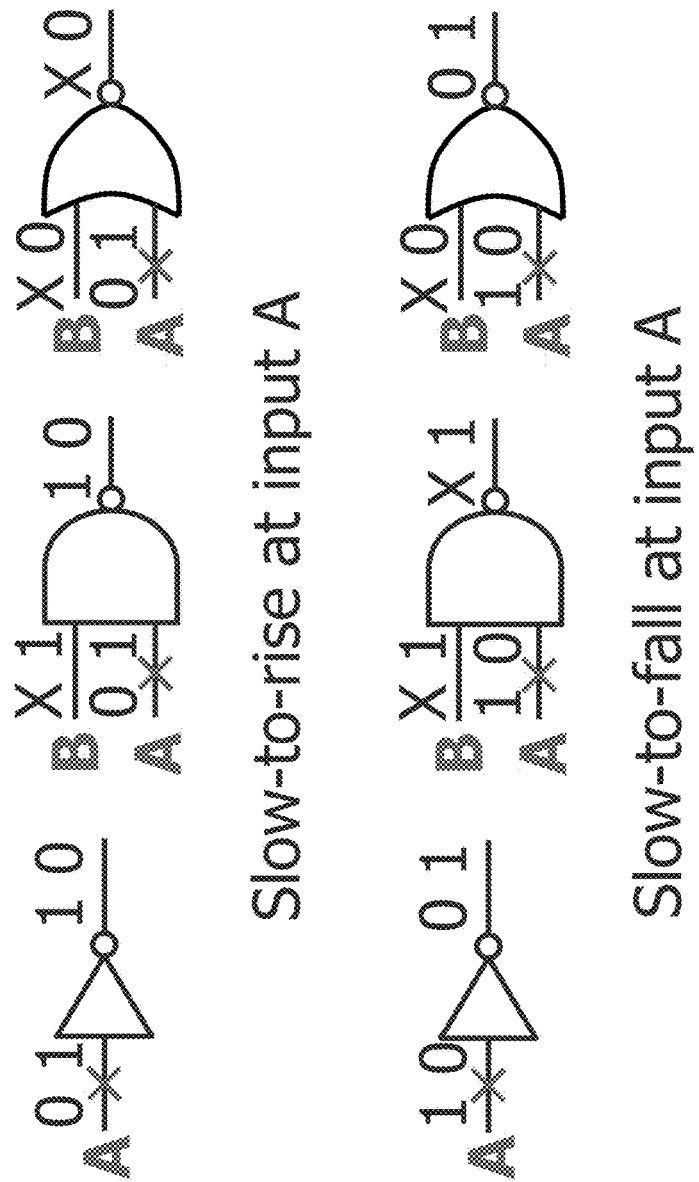
FIG. 6 illustrates necessary assignments to detect slow-to-rise and slow-to-fall transition faults at the input A of the three primitive cells shown in FIG. 5.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Test Generation and Cell Transition Fault Models

Tests are applied at several steps in the hardware manufacturing flow, and for certain products, may also be used for hardware maintenance in the consumer's environment. Most tool-supported design-for-test (design-for-testability) practiced in the industry, at least for digital circuits, is predicated on a structural test paradigm. Structural testing, in contrast to functional testing, makes no direct attempt to ascertain the intended functionality of the circuit under test. Instead, it tries to make sure that the circuit has been assembled correctly from some low-level building blocks as specified in a structural netlist such as a gate-level netlist. The stipulation is that the circuit should function correctly if the netlist is correct and structural testing has confirmed the correct assembly of the structural circuit elements.

Scan testing has been widely used in the industry due to increased controllability and observability and thus high defect coverage. The high controllability and observability are achieved by the so-called "scan insertion" inserting additional test logic into circuit designs. Scan insertion includes two steps: first, replace plain memory cells like flip flops or latches by scan cells; and second, connect these together to form one or more chains. Scan cells can be operated in two modes, the functional/mission mode used during normal operation and the scan mode that allows shifting in test stimuli (also referred to as tests, test patterns, et al.) or shifting out captured test responses through the scan chains.

Test patterns are generated through an automatic test pattern generation (ATPG) process. ATPG has focused on a set of faults derived from a gate-level fault model. A defect is an error caused in a device during the manufacturing process. A fault model is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period.

The disclosed technology uses a cell transition fault model to detect transistor stuck-open faults inside complex cells. For a given cell modeled at the gate level, a cell transition is defined at a cell input I, Two cell transition faults, rising and falling faults, are associated with the cell input I. To detect them, the test includes two vectors which should three conditions: 1) The test launches a rising (falling) transition at the cell input I; 2) the assignments at other cell inputs sensitize the launched transition from the cell input I to a cell output Z, wherein the sensitizing means that a transition is produced at the cell output Z, which is uniquely determined by the transition launched from the cell input I, i.e., changing the second vector value at the cell input I to have the same value as the first vector at the cell input I causes no transition at the cell output Z; and 3) after the sensitized rising (falling) transition reaches to the cell output Z, the second vector needs to sensitize a propagation path that propagates the value at the cell output Z to an observation point. It is worth pointing out that while the two vectors are needed to produce a transition at the cell output Z, it is the second vector that allows the transistor stuck-open fault associated with the cell input I to be observed at an observation point.

Figure 8A:
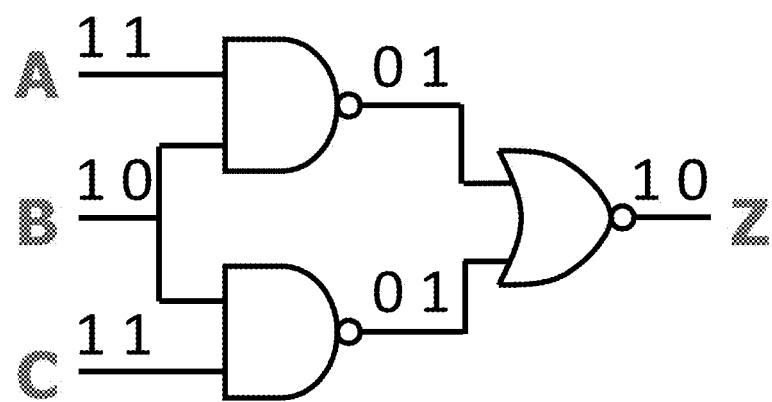
FIG. 8A shows an example of a test detecting the falling cell transition fault associated with an input B of a complex cell.
Figure 8B:
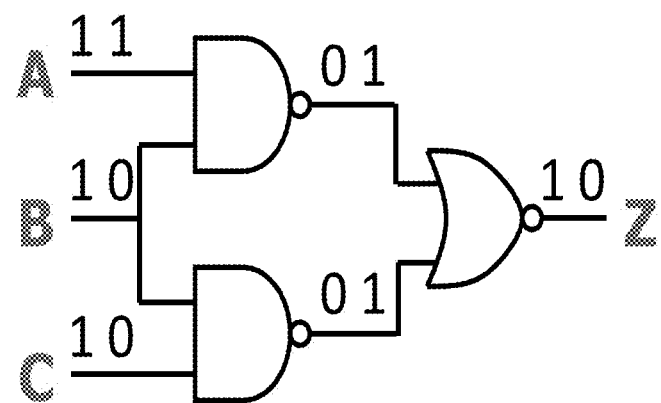
FIG. 8B shows an example of an invalid test for the same fault in FIG. 8A.

FIG. 8A shows an example of a test detecting the falling cell transition fault associated with an input B. The assignments {A, C}={11, 11} are necessary assignments to propagate the launched falling transition from the input B to the output Z. However, the test shown in FIG. 8B is an invalid test for the same fault because the transition at Z still exists even after changing the second vector value at B from 0 to 1, violating the second condition about the sensitizing discussed above.

Figure 9:
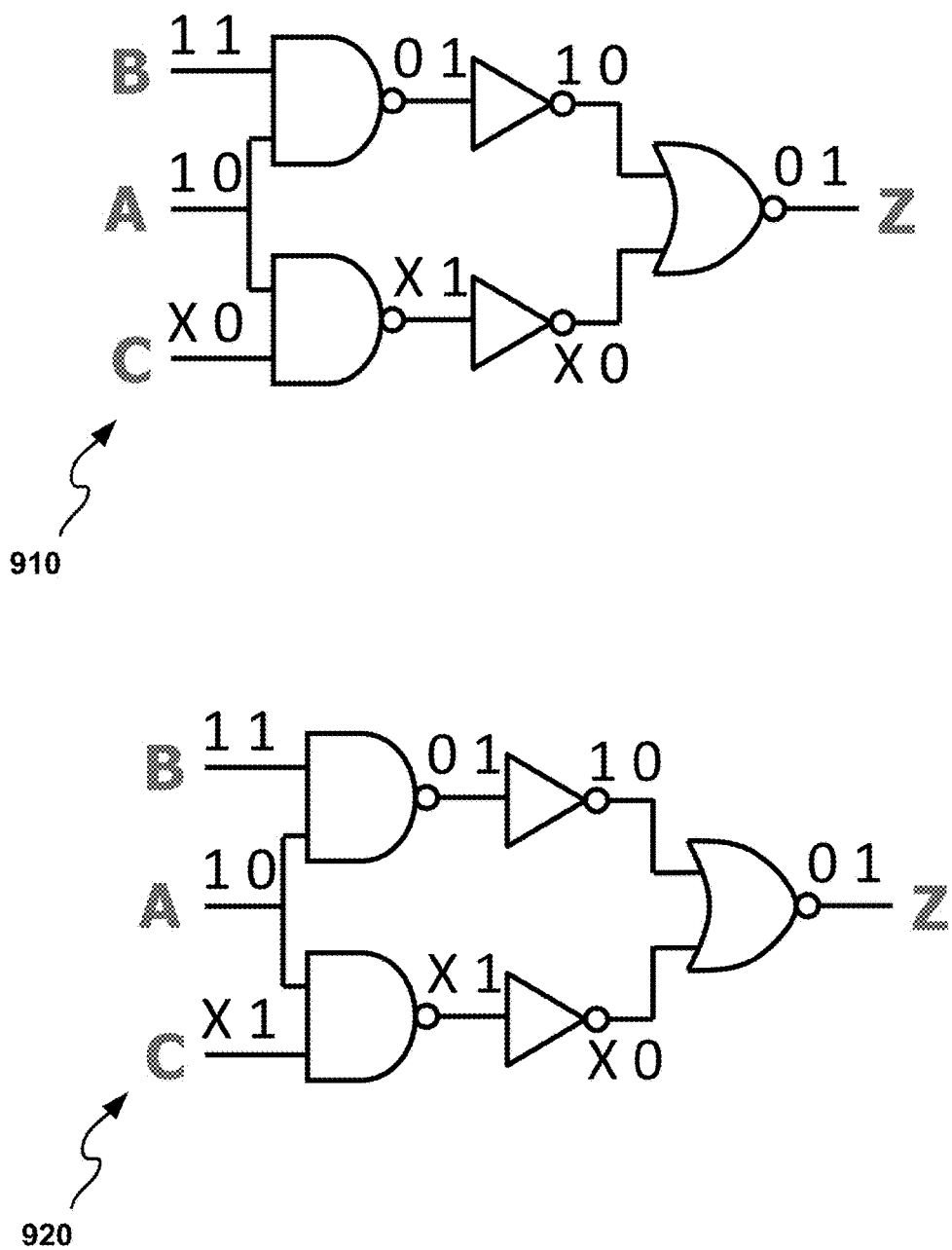
FIG. 9 illustrates two input assignments (910 and 920) for detecting a falling cell transition fault associated with the input A of the complex cell 720 in FIG. 7.

It is also worth pointing out that the disclosed cell transition fault model does not require all gate level structural paths between a cell input and its output be sensitized simultaneously. If the aforementioned conditions are met for one or more structural paths inside the cell, the fault is said to be detected. For example, both gate level structural paths in FIG. 8A have to be sensitized simultaneously in order to propagate the falling transition from B to Z. FIG. 9 illustrates two input assignments (910 and 920) for detecting a falling cell transition fault associated with the input A of the complex cell 720. Both the assignments {A, B, C}={10, 11, X0} (910) and {A, B, C}={10, 11, X1} (920) meet the sensitization condition that propagates the falling transition from the input A to the output Z. The former (910) sensitizes one structural path (the top one) between A and Z while the latter (920) sensitizes two structural paths simultaneously. Both tests detect P1 stuck-open shown in FIG. 7.

With various implementations of the disclosed technology, the cell transition fault model may be enhanced to increase the number of transistor stuck-open faults detected without using the switch level netlist. In some complex cells, the inversion between a cell input and its output is not unique and/or a cell input may reach to more than one cell output. These cell structures may make the test set generated by using the cell transition fault model on only one cell input-output pair miss some detectable transistor stuck-open faults. By considering all input-output combinations, the total number of fault sites in the cell is bounded by the product of the number of cell inputs and the number of its outputs. The cell input and output pair are not considered as a valid fault site when there is no structural path between them.

Figure 10:
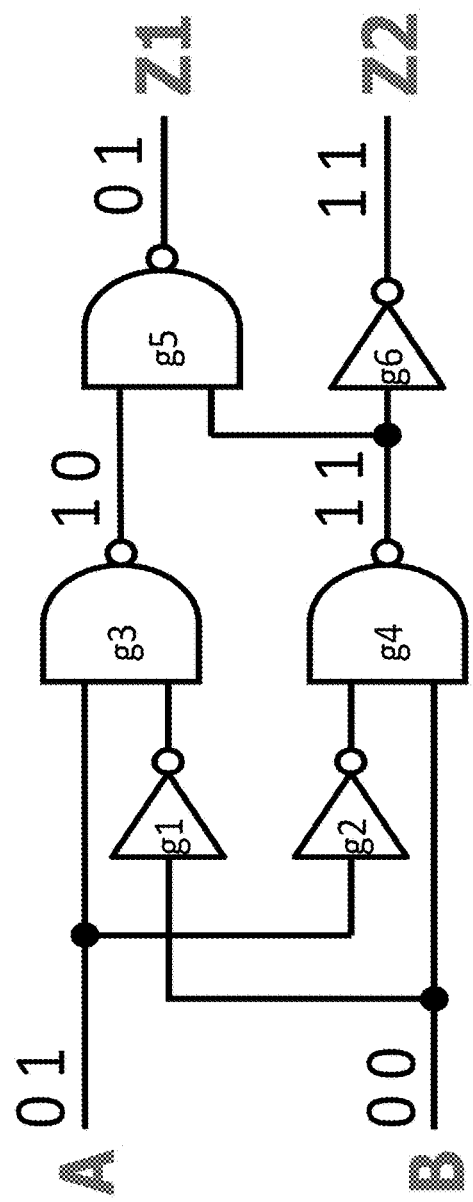
FIG. 10 illustrates an example of a complex cell with two inputs and two outputs.

At each fault site, the number of cell transition faults may be determined by the product of following two parameters: Two transitions, rising and falling, at the cell input and the number of possible inversions traversing from the cell input to one of the outputs. FIG. 10 illustrates an example of a complex cell with two inputs and two outputs. The total number of fault sites is equal to 4, i.e., A→Z1, A→Z2, B→Z1, and B→Z2. When considering the fault site A→Z1, there are two transitions launched from A and two possible inversions between A and Z1, i.e., a no inversion path A→g3→g5→Z1 and an inversion path A→g2→g4→g5→Z1. Therefore, the total number of the cell transition faults associated with the fault site A→Z1 is four, i.e., {A rising, Z1 rising}, {A rising, Z1 falling}, {A falling, Z1 rising}, and {A falling, Z1 falling}. In FIG. 10, the assignment for detecting the cell transition faults associated with {A rising, Z1 rising} is shown.

Similarly, there are two paths from between B and Z1, i.e., a path B→g4→g5→Z1 and an inversion path B→g1→g3→g5→Z1. Therefore, the total number of the cell transition faults associated with the fault site B→Z1 is four as well.

On the other hand, there is only one path between either of A and Z2 and B and Z2. Therefore, the total number of enhanced cell transition faults associated with the fault site A→Z2 and B→Z2 is four. Accordingly, the total number of the cell transition faults for the complex cell shown in FIG. 10 is equal to twelve.

At the cell boundary, all stuck-at and transition faults may be detected by the cell transition fault model. At the switch level, a cell consists of fully complementary p-FET and n-FET networks, bidirectional transistors, and/or transmission transistors, etc. Since each cell transition fault has its fault site defined at the cell boundary, the generated test pattern set may not detect all transistor stuck-open faults inside the cell. However, following lemma shows the completeness of detecting all transistor stuck-open faults for certain type of cells.

Lemma: If the cell is implemented by a p-FET network and a complementary n-FET network and every cell input drives one p-FET and one n-FET in the cell only, the test set generated by using the cell transition fault model detects all detectable transistor stuck-open faults in the cell.

Proof: Let us consider an n-FET transistor stuck-open fault $f_n$ driven by the cell input I and a two-vector test that detects the rising cell transition fault at I first. Because the p-FET network is fault free, the first vector in the test must produce 1 at the cell output. If the n-FET network is fault free, the second vector in the same test produces 0 at the cell output. Since the conditions sensitizing I in the second vector detect I stuck-at-0 fault and I stuck-at-0 is functionally equivalent to shut off all the discharging paths passing through the n-FET with $f_n$, the cell output will have the faulty value 1 in the presence of $f_n$. Therefore, $f_n$ is detected. As a result, the test set detecting all the rising cell transition faults at the cell inputs detects all n-FET transistor stuck-open faults. Similarly, the test set detecting all the falling cell transition faults at the cell inputs detects all p-FET transistor stuck-open faults.

Figure 7:
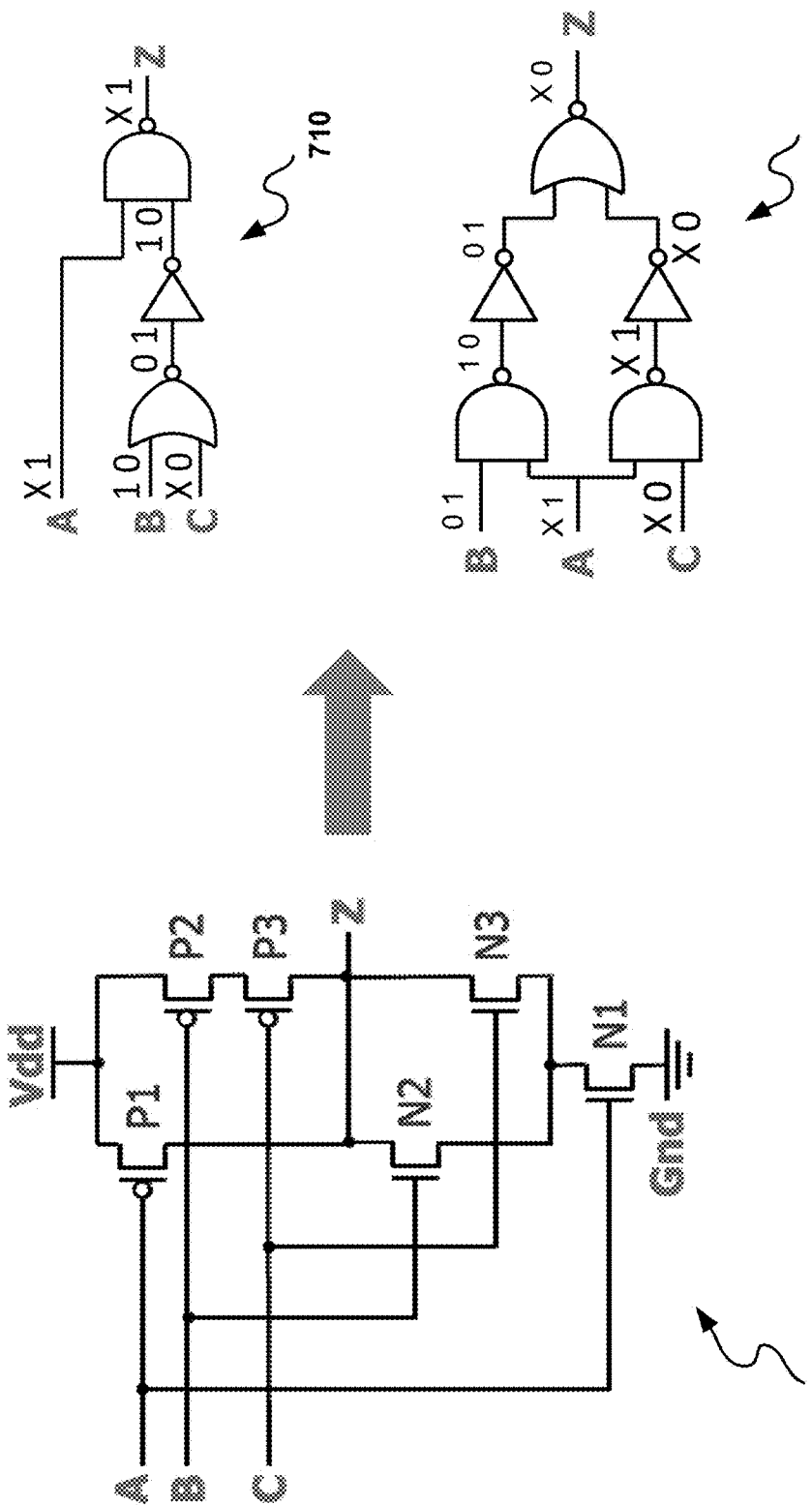
FIG. 7 illustrates two gate-level models, 710 and 720, for a complex cell 700.

For example, to detect the falling cell transition fault at B of the cell 700 in FIG. 7, the test generated by using the gate level netlist 710 is {A, B, C}={11, 10, X0}. The same test is generated when using the gate level netlist 720. As a result, the generated test detects P2 stuck-open shown in FIG. 7 and it is independent of the gate level netlist used to model the cell. Since the cell 700 meets the conditions required by the lemma, it is easy to verify that the test set detecting all cell transition faults detects all transistor stuck-open faults inside the cell. It is worth pointing out that all unate functions can be implemented by a network meeting the conditions required by the lemma. As a result, the test set detecting all cell transition faults at the inputs of a cell detects all transistor stuck-open faults inside this cell.

Test Generation Tool

Figure 11:
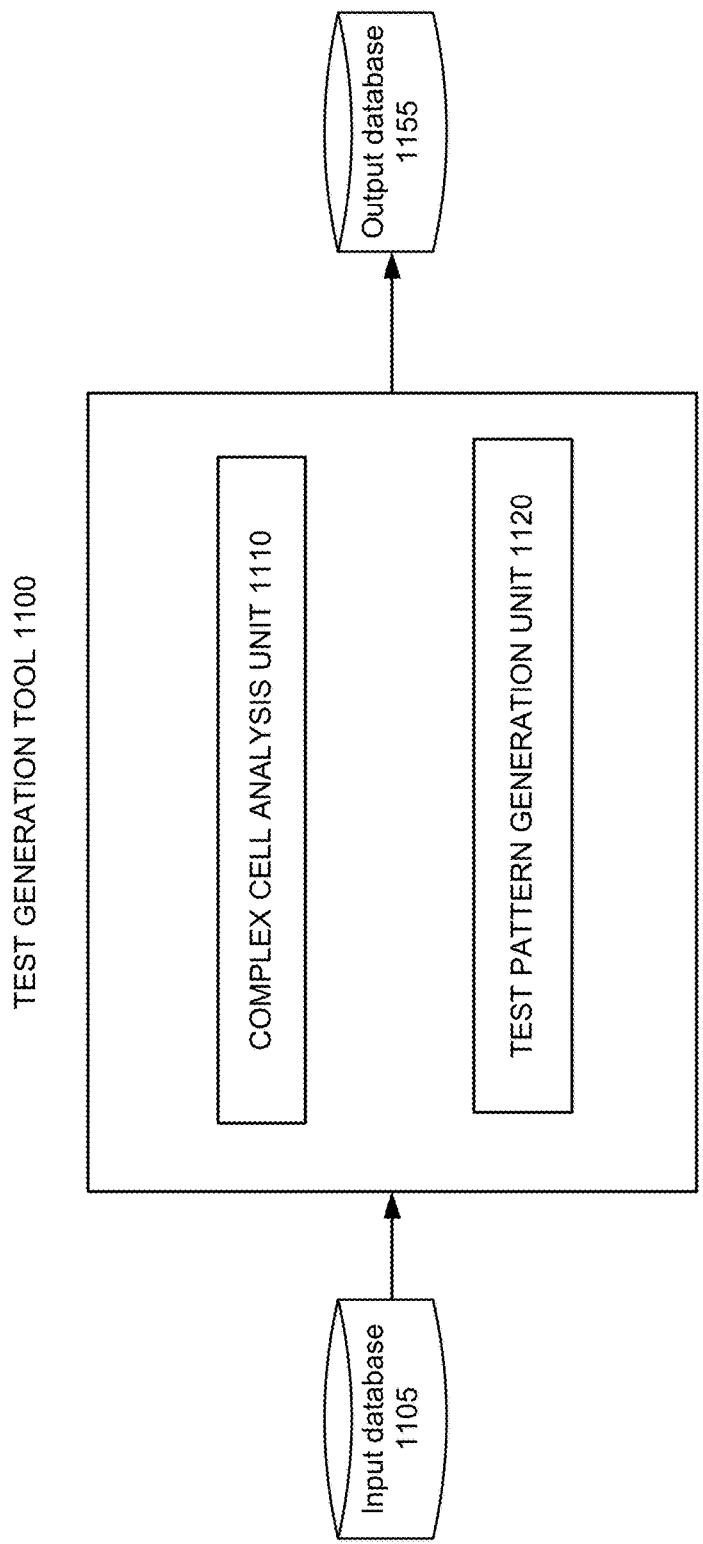
FIG. 11 illustrates an example of a test generation tool 1100 that may be implemented according to various embodiments of the disclosed technology.

FIG. 11 illustrates an example of a test generation tool 1100 that may be implemented according to various embodiments of the disclosed technology. As seen in this figure, the test generation tool 1100 includes a complex cell analysis unit 1110 and a test pattern generation unit 1120. The test generation tool 1100 may be an ATPG tool or a part of an ATPG tool. Some implementations of the test generation tool 1100 may cooperate with (or incorporate) one or more of an input database 1105 and an output database 1185.

As will be discussed in more detail below, the test generation tool 1100 may receive a gate-level representation of a circuit design from the database 1105. The complex cell analysis unit 1110 determines, based on the gate-level representation, an assignment at inputs of a complex cell in the circuit design for two consecutive clock cycles. The complex cell is represented with two or more logic gates in the gate-level representation. The assignment consists of a first part for one of the inputs representing a first transition at the one of the inputs and a second part for rest of the inputs sensitizing the first transition. The sensitizing means allowing the first transition and only the first transition to cause a second transition at an output of the complex cell.

The test pattern generation unit 1120 then derives, based on the gate-level representation, a test pattern. The test pattern, when being applied to a circuit fabricated based on the circuit design, can generate the assignment at the inputs and propagates a value at the output corresponding to the second clock cycle of the two consecutive clock cycles from the output to an observation point. The observation point may be a primary output or a scan cell. The test generation tool 1100 stores the test pattern in the output database 1155.

As previously noted, various examples of the disclosed technology may be implemented by one or more computing systems, such as the computing system illustrated in FIGS. 1 and 2. Accordingly, one or both of the complex cell analysis unit 1110 and the test pattern generation unit 1120 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or both of the complex cell analysis unit 1110 and the test pattern generation unit 1120. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the complex cell analysis unit 1110 and the test pattern generation unit 1120 are shown as separate units in FIG. 11, a single computer (or a single processor within a master computer) or a single computer system may be used to implement all of these units at different times, or components of these units at different times.

With various examples of the disclosed technology, the input database 1105 and the output database 1155 may be implemented using any suitable computer readable storage device. That is, either of the input database 1105 and the output database 1155 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 1105 and the output database 1155 are shown as separate units in FIG. 11, a single data storage medium may be used to implement some or all of these databases.

Test Pattern Generation Based on Cell Transition Fault Model

Figure 12:
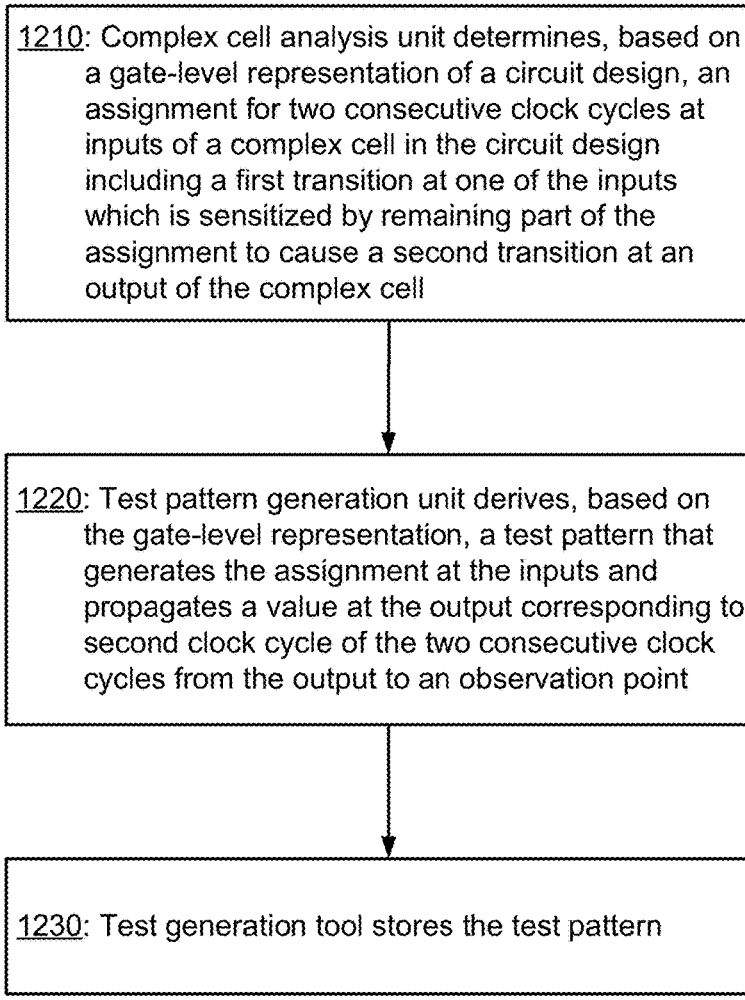
FIG. 12 illustrates a flowchart 1200 showing a process of test pattern generation based on the cell transition fault model that may be implemented according to various examples of the disclosed technology.

FIG. 12 illustrates a flowchart 1200 showing a process of test pattern generation based on the cell transition fault model that may be implemented according to various examples of the disclosed technology. For ease of understanding, methods of test pattern generation based on the cell transition fault model that may be employed according to various embodiments of the disclosed technology will be described with reference to the test generation tool 1100 in FIG. 11 and the flow chart 1200 illustrated in FIG. 12. It should be appreciated, however, that alternate implementations of a test generation tool 1100 may be used to perform the methods of test pattern generation based on the cell transition fault model illustrated by the flow chart 1200 according to various embodiments of the disclosed technology. Likewise, the test generation tool 1100 may be employed to perform other methods of test pattern generation based on the cell transition fault model according to various embodiments of the disclosed technology.

In operation 1210, the complex cell analysis unit 1110 determines, based on a gate-level representation of a circuit design, an assignment for two consecutive clock cycles at inputs of a complex cell in the circuit design including a first transition at one of the inputs which is sensitized by remaining part of the assignment to cause a second transition at an output of the complex cell. The complex cell implements a non-primitive Boolean function and is represented by two or more logic gates in the gate-level representation. The gate-level representation may be a gate-level netlist. The assignment consists of a first part for the one of the inputs representing a first transition at the one of the inputs and a second part for rest of the inputs sensitizing the first transition. The first transition may be a falling transition, "1" to "0", or a rising transition, "0" to "1". The sensitizing means that the first transition and only the first transition is allowed to cause a second transition at an output of the complex cell. In another word, the second transition is produced at the output, which is uniquely determined by the first transition, i.e., changing the value at the input corresponding to the second clock cycle of the two consecutive clock cycles to be the same value corresponding to the first clock cycle causes no transition at the output.

In operation 1220, the test pattern generation unit 1120 derives, based on the gate-level representation, a test pattern that generates the assignment at the inputs and propagates a value at the output corresponding to second clock cycle of the two consecutive clock cycles from the output to an observation point. The observation point may be a scan cell or a primary output. This operation is similar to the fault activation and propagation operation performed by a conventional ATPG tool. Thus the test pattern generation unit 1120 may be implemented by a commercially available ATPG tool. As noted previously, even though a transition should be produced at the output, only the value corresponding to the second clock cycle needs to be propagated.

In operation 1230, the test generation tool 1100 stores the test pattern. The test pattern can be used to test integrated circuit devices fabricated based, at least in part, on the circuit design. Usually automatic test equipment (ATE) is used to perform tests on the devices. ATE applies the test pattern to the devices and collect test responses.

To detect transistor stuck-open faults associated with various transistors in the complex cell, the operations 1210-1230 may be repeated by changing the first transition to an opposite transition. The operations 1210-1230 may also be repeated by changing the second transition to an opposite transition if there is a different structural path from the input to the output. The operations 1210-1230 may further be repeated if the complex cell has a second output and a transition at the input can cause a transition at the second output.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
    determining, by the at least one processor and based on a gate-level representation of a circuit design, an assignment for two consecutive clock cycles at inputs of a complex cell in the circuit design including a first transition at one of the inputs which is sensitized by remaining part of the assignment to cause a second transition at an output of the complex cell, the complex cell being represented by two or more logic gates in the gate-level representation, and the sensitizing meaning that the output has no transition if the one of the inputs has no transition while the remaining part of the assignment does not change;
    deriving, by the at least one processor and based on the gate-level representation, a test pattern that generates the assignment at the inputs and propagates a value at the output corresponding to second clock cycle of the two consecutive clock cycles from the output to an observation point; and
    storing, by the at least one processor, the test pattern, wherein the test pattern is thereafter used to test integrated circuit devices fabricated based, at least in part, on the circuit design, by applying the test pattern to the integrated circuit devices.

2. The method recited in claim 1, wherein the gate-level representation is a gate-level netlist.

3. The method recited in claim 1, further comprising:
    repeating the determining, the deriving and the storing by the at least one processor by replacing the first transition with a third transition, the third transition being opposite to the first transition.

4. The method recited in claim 1, further comprising:
    repeating the determining, the deriving and the storing by the at least one processor by replacing the second transition with a third transition, the third transition being opposite to the second transition.

5. The method recited in claim 1, further comprising:
    repeating the determining, the deriving and the storing by the at least one processor by replacing the second transition with a third transition at a second output of the complex cell.

6. The method recited in claim 1, wherein the method is performed by executing an automatic test pattern generation (ATPG) tool in the computer.

7. The method recited in claim 1, wherein the observation point is a primary output or a scan cell.

8. One or more non-transitory processor-readable media storing processor-executable instructions for causing one or more processors to perform a method, the method comprising:
    determining, based on a gate-level representation of a circuit design, an assignment for two consecutive clock cycles at inputs of a complex cell in the circuit design including a first transition at one of the inputs which is sensitized by remaining part of the assignment to cause a second transition at an output of the complex cell, the complex cell being represented by two or more logic gates in the gate-level representation, and the sensitizing meaning that the output has no transition if the one of the inputs has no transition while the remaining part of the assignment does not change;
    deriving, based on the gate-level representation, a test pattern that generates the assignment at the inputs and propagates a value at the output corresponding to second clock cycle of the two consecutive clock cycles from the output to an observation point; and
    storing the test pattern, wherein the test pattern is thereafter used to test integrated circuit devices fabricated based, at least in part, on the circuit design, by applying the test pattern to the integrated circuit device.

9. The one or more non-transitory processor-readable media recited in claim 8, wherein the gate-level representation is a gate-level netlist.

10. The one or more non-transitory processor-readable media recited in claim 8, wherein the method further comprises:
    repeating the determining, the deriving and the storing by replacing the first transition with a third transition, the third transition being opposite to the first transition.

11. The one or more non-transitory processor-readable media recited in claim 8, wherein the method further comprises:
    repeating the determining, the deriving and the storing by replacing the second transition with a third transition, the third transition being opposite to the second transition.

12. The one or more non-transitory processor-readable media recited in claim 8, wherein the method further comprises:
    repeating the determining, the deriving and the storing by replacing the second transition with a third transition at a second output of the complex cell.

13. The one or more non-transitory processor-readable media recited in claim 8, wherein the processor-executable instructions are a part of an automatic test pattern generation (ATPG) tool.

14. The one or more non-transitory processor-readable media recited in claim 8, wherein the observation point is a primary output or a scan cell.

15. A system, comprising:
    one or more processors, the one or more processors programmed to perform a method, the method comprising:
    determining, based on a gate-level representation of a circuit design, an assignment for two consecutive clock cycles at inputs of a complex cell in the circuit design including a first transition at one of the inputs which is sensitized by remaining part of the assignment to cause a second transition at an output of the complex cell, the complex cell being represented by two or more logic gates in the gate-level representation, and the sensitizing meaning that the output has no transition if the one of the inputs has no transition while the remaining part of the assignment does not change;

deriving, based on the gate-level representation, a test pattern that generates the assignment at the inputs and propagates a value at the output corresponding to second clock cycle of the two consecutive clock cycles from the output to an observation point; and storing the test pattern, wherein the test pattern is thereafter used to test integrated circuit devices fabricated based, at least in part, on the circuit design, by applying the test pattern to the integrated circuit device.

16. The system recited in claim 15, wherein the gate-level representation is a gate-level netlist.

17. The system recited in claim 15, wherein the method further comprises:

repeating the determining, the deriving and the storing by replacing the first transition with a third transition, the third transition being opposite to the first transition.

18. The system recited in claim 15, wherein the method further comprises:

repeating the determining, the deriving and the storing by replacing the second transition with a third transition, the third transition being opposite to the second transition.

19. The system recited in claim 15, wherein the method further comprises:

repeating the determining, the deriving and the storing by replacing the second transition with a third transition at a second output of the complex cell.

* * * * *